(12) United States Patent
Furukawa et al.

(10) Patent No.: US 6,936,852 B2
(45) Date of Patent: *Aug. 30, 2005

(54) SEMICONDUCTOR LIGHT EMITTING DEVICE AND METHOD FOR MANUFACTURING SAME

(75) Inventors: Chisato Furukawa, Atsugi (JP); Masayuki Morishita, Zama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/410,741

(22) Filed: Apr. 10, 2003

(65) Prior Publication Data

US 2003/0218228 A1 Nov. 27, 2003

Related U.S. Application Data

(63) Continuation of application No. 09/921,611, filed on Jul. 31, 2001, now Pat. No. 6,576,931.

(30) Foreign Application Priority Data

Jul. 31, 2000 (JP) ........................................ 2000-232050

(51) Int. Cl.[7] ........................... H01L 27/15; H01L 23/29
(52) U.S. Cl. ........................... 257/79; 257/98; 257/789; 257/795
(58) Field of Search ........................... 257/79, 98, 789, 257/795

(56) References Cited

U.S. PATENT DOCUMENTS

| 6,066,861 A | 5/2000 | Hohn et al. | 252/301.36 |
| 6,204,523 B1 | 3/2001 | Carey et al. | 257/100 |
| 6,252,254 B1 | 6/2001 | Soules | 257/98 |
| 6,294,800 B1 | 9/2001 | Duggal et al. | 257/100 |
| 6,333,522 B1 * | 12/2001 | Inoue et al. | 257/99 |

FOREIGN PATENT DOCUMENTS

| CN | 1228873 | 9/1999 |
| JP | 10-173240 | 6/1998 |
| JP | 10-284759 | 10/1998 |
| JP | 2000-208815 | 7/2000 |
| JP | 2000-347601 | 12/2000 |
| WO | 9750132 | 12/1997 |

* cited by examiner

Primary Examiner—Allan R. Wilson
Assistant Examiner—Joseph Nguyen
(74) Attorney, Agent, or Firm—Hogan & Hartson, LLP

(57) ABSTRACT

A semiconductor light emitting device ensuring a uniform color tone comprises a semiconductor light emitting element that emits light of a first wavelength upon injection of a current, a fluorescent material portion that contains a fluorescent material excited by light of the first wavelength to emit light of a second wavelength, and a diffuser mixed in an appropriate material around the semiconductor light emitting element.

3 Claims, 15 Drawing Sheets

(a)

(b)

(a)

(b)

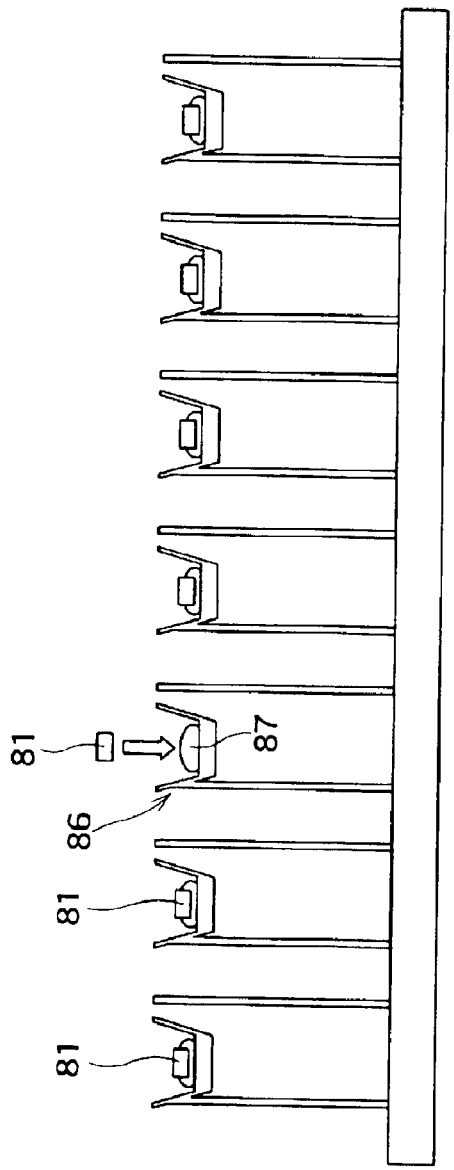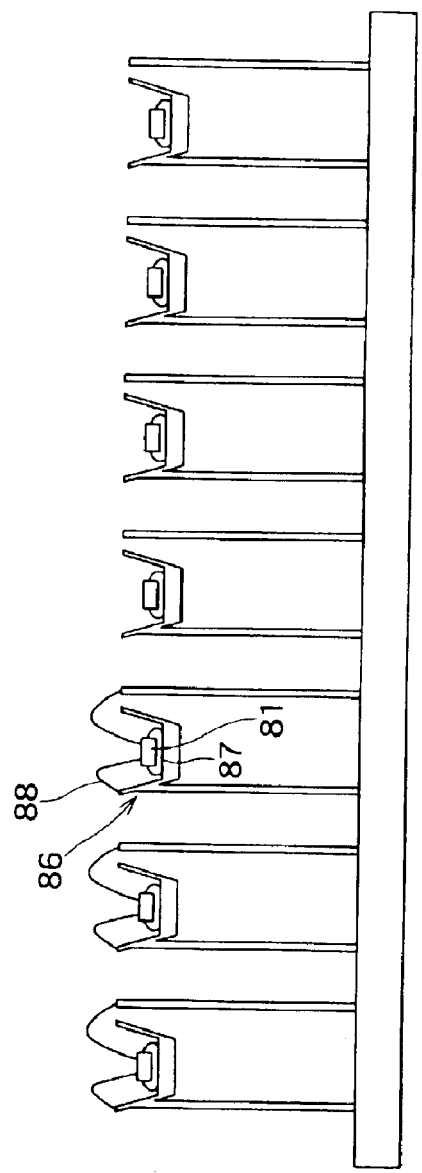

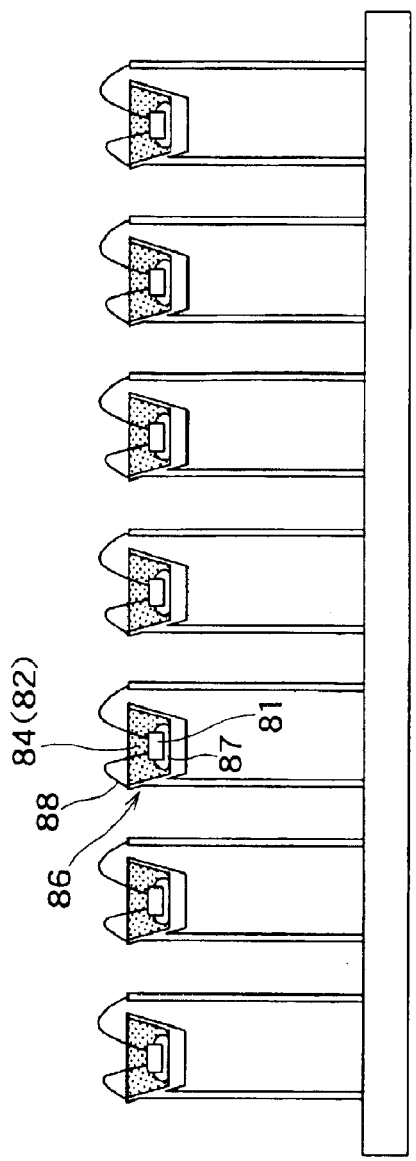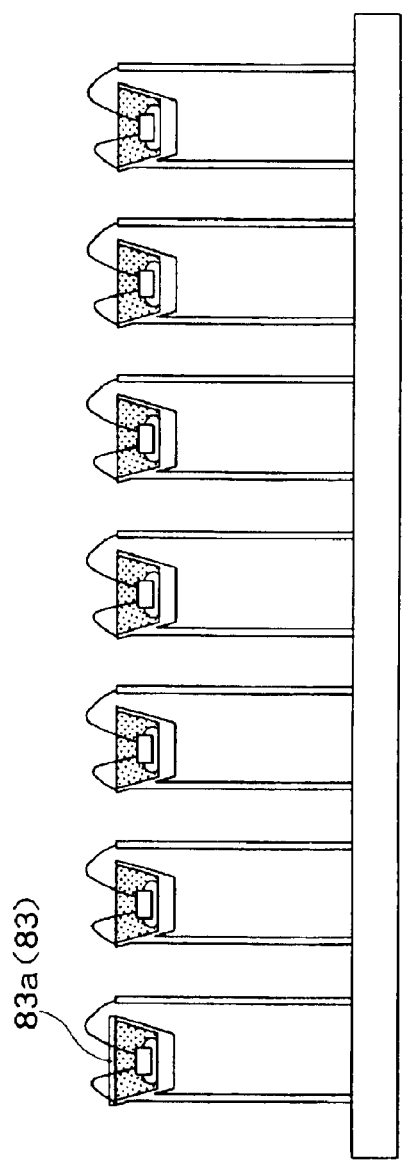

SEMICONDUCTOR LIGHT EMITTING DEVICE AND METHOD FOR MANUFACTURING SAME

This is a continuation of application Ser. No. 09/921,611 filed Jul. 31, 2001, now U.S. Pat. No. 6,576,931, which application is hereby incorporated by reference in its entirety.

CROSS REFERENCE TO RELATED APPLICATION

This application is based upon and claims the benefit of priority from the prior Japanese Patent Application No. 2000-232050, filed on Jul. 31, 2000, the entire contents of which are incorporated herein by reference.

BACKGROUND OF THE INVENTION

1. Field of the Invention

This invention relates to a semiconductor light emitting device and its manufacturing method, and more particularly, to a semiconductor device using a fluorescent material and its manufacturing method.

2. Related Background Art

Light emitting devices combining a semiconductor light emitting element like LED (light emitting diode) and a fluorescent material are remarked as inexpensive and long-life light emitting devices, and they are being used widely. Among semiconductor light emitting devices, those for emitting white light are especially regarded hopeful for various ways of use as light emitting devices that can substitute for fluorescent lamps or as light sources of display devices. Semiconductor white light emitting devices use a structure combining a semiconductor light emitting element for emission of blue light or ultraviolet light (UV emission) and a fluorescent material excited by light emitted by the light emitting element. For example, semiconductor white light emitting devices generally used today include those of a structure combining a semiconductor blue light emitting element made of GaN semiconductors and a YAG fluorescent material. Semiconductor white light emitting devices of this type realize white light by color mixture obtained from blue emission spectrums near the center wavelength of 450 [nm] from light emitting elements and broad spectrums having peaks near the wavelength of 560 [nm] which are emitted from YAG fluorescent materials in response to emission of the light emitting elements.

In current semiconductor white light emitting devices, fluorescent materials are usually coated around the semiconductor light emitting element. These devices, however, are subjected to differences in thickness of fluorescent materials through which light from semiconductor light emitting elements pass, and involve the problem of variance in color tone depending on view angles.

Semiconductor light emitting devices are often used in form of an array. In this case, different color tones of light emitting devices, even if small, are easily visible to naked eyes, and it has been desirable that differences in color tone are minimized. Especially with white light emitting devices, variance in color tone is more visible, and it has been inconvenient that color tone changes depending upon view angles.

SUMMARY OF THE INVENTION

The present invention is based on recognition of that problem. It is therefore an object of the invention to provide a semiconductor light emitting device comprising at least a semiconductor light emitting element and a fluorescent material portion including a fluorescent material excited by light from the semiconductor light emitting element and ensuring a uniform color tone.

According to an embodiment of the invention, there is provided a semiconductor light emitting device comprising:

a semiconductor light emitting element which emits light of a first wavelength when a current is injected thereto; and a fluorescent material portion containing in mixture a fluorescent material and a diffuser, said fluorescent material being excited by light of the first wavelength to emit light of a second wavelength.

According to an embodiment of the invention, there is further provided a semiconductor light emitting device comprising:

a semiconductor light emitting element which emits ultraviolet light when a current is injected thereto; and a fluorescent material portion including silicone resin which contain in mixture a blue emission fluorescent material excited by the ultraviolet light to emit blue light, a green emission fluorescent material excited by the ultraviolet light to emit green light, a red emission fluorescent material excited by the ultraviolet light to emit red light, and a diffuser.

According to an embodiment of the invention, there is further provided a semiconductor light emitting device comprising:

a semiconductor light emitting element which emits light of a first wavelength when a current is injected thereto;

a fluorescent material portion containing in mixture a fluorescent material excited by light of the first wavelength to emit light of a second wavelength; and a diffuser portion which is a separate element from the fluorescent material portion and contains in mixture a diffuser.

According to an embodiment of the invention, there is further provided a manufacturing method of a semiconductor light emitting device, comprising:

forming a semiconductor light emitting element which emits light of a first wavelength when a current is injected thereto; and forming a fluorescent material portion which contains in mixture a fluorescent material excited by light of the first wavelength to emit light of a second wavelength, and a diffuser.

According to an embodiment of the invention, there is further provided a manufacturing method of a semiconductor light emitting device, comprising:

forming a semiconductor light emitting element which emits light of a first wavelength when a current is injected thereto;

forming a fluorescent material portion which contains in mixture a fluorescent material excited by light of the first wavelength to emit light of a second wavelength; and forming a diffuser portion which is a separate member from the fluorescent material portion and contains in mixture a diffuser.

BRIEF DESCRIPTION OF THE DRAWINGS

FIG. 16A is a schematic cross-sectional view that shows a manufacturing method of the semiconductor light emitting device according to the seventh embodiment of the invention;

FIG. 16B is a schematic cross-sectional view, following to FIG. 16A, which shows the manufacturing method of the semiconductor light emitting device according to the seventh embodiment of the invention;

FIG. 16C is a schematic cross-sectional view, following to FIG. 16B, which shows the manufacturing method of the semiconductor light emitting device according to the seventh embodiment of the invention;

FIG. 16D is a schematic cross-sectional view, following to FIG. 16C, which shows the manufacturing method of the semiconductor light emitting device according to the seventh embodiment of the invention;

DETAILED DESCRIPTION OF THE INVENTION

Some embodiments will now be explained below with reference to the drawings. All semiconductor light emitting devices explained below are those for emitting white light. SMD using RGB fluorescent materials will be explained as first to fifth embodiments, LED lamps using YAG fluorescent materials will be explained as sixth to eighth embodiments, and other devices will be explained as ninth and tenth embodiments.

(First Embodiment)

Figure 1:
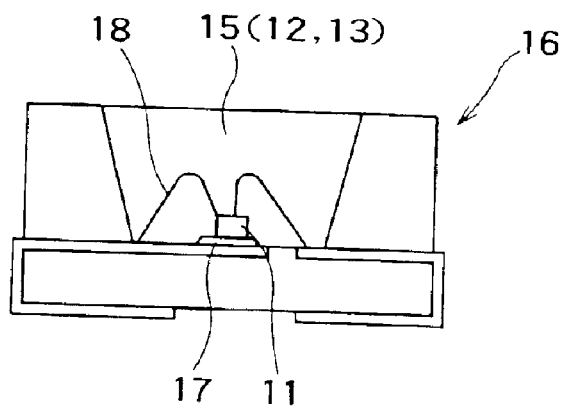
FIG. 1 is a schematic cross-sectional view of a semiconductor light emitting device according to the first embodiment of the invention.

The semiconductor light emitting device taken as the first embodiment is a semiconductor light emitting device for emitting white light, which is called a surface mounted device (hereinafter abbreviated as SMD). One of features of the semiconductor light emitting device according to the instant embodiment lies in, as shown in FIG. 1, introducing an appropriate amount of diffuser 13 into silicone resin used as sealing resin 15. Used as a semiconductor light emitting element 11 is an element made of GaN materials and emitting ultraviolet light when a current is injected. Used as fluorescent materials 12 are three kinds of fluorescent materials, namely, a red fluorescent material excited by ultraviolet emission to emit red light, a green fluorescent material excited by ultraviolet emission to emit green light, and a blue fluorescent material excited by ultraviolet emission to emit blue light (hereinafter abbreviated as RGB fluorescent materials). Used as the diffuser 13 is alumina ($Al_2O_3$) powder.

The embodiment is explained below in greater detail. FIG. 1 is a schematic cross-sectional view of the semiconductor light emitting device according to the first embodiment. The semiconductor light emitting element 11 made of GaN materials and emitting ultraviolet light upon injection of a current is bonded inside a reflector of a frame 16 with an adhesive 17 such as silver paste. Both p and n electrodes of the semiconductor light emitting device 11 are connected to the frame 16 by a wire 18 of Au, for example. Interior of the reflector of the frame 16 is filled with silicon resin 15. RGB fluorescent materials 12 and diffuser 13 are mixed into the silicon resin 15. In the device of FIG. 1, weight % concentration of the diffuser 13 in the silicon resin 15 is 2%. In the device of FIG. 1, the silicon resin 15 is commonly used as sealing resin for covering the semiconductor light emitting element 11, fluorescent material portion including fluorescent materials 12 and diffuser portion including the diffuser 13.

A manufacturing method of the semiconductor light emitting device according to the first embodiment is briefly explained with reference to FIGS. 2(a) and 2(b).

Figure 2:
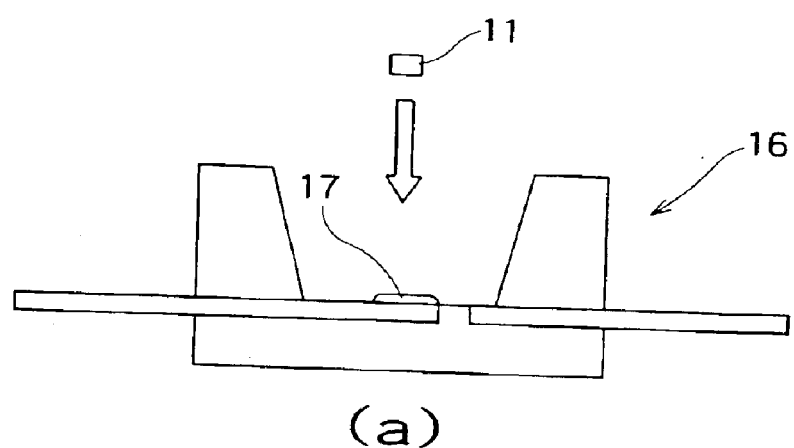
FIGS. 2(a) and 2(b) are schematic cross-sectional views that show a manufacturing method of the semiconductor light emitting device according to the first embodiment of the invention.
Figure 2:
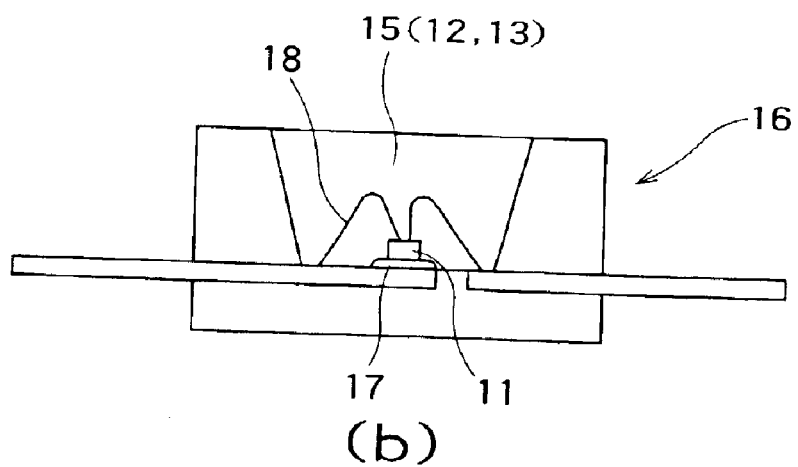

First as shown in FIG. 2(a), the semiconductor light emitting element 11 is fixed inside the reflector of the frame 16 by using the adhesive 17 such as silver paste.

Next as shown in FIG. 2(b), both p and n electrodes of the semiconductor light emitting element 11 are connected to the frame 16 with a wire 17 of Au, for example. Simultaneously, predetermined compounding ratios of RGB fluorescent materials 12 and alumina powder (diffuser) 13 are mixed in silicone resin that will become the sealing resin 15, and the preparation is stirred well to uniformly diffuse the fluorescent materials 12 and the diffuser 13. Then the resin undergoes evacuation to degas the resin. Degassing may be conducted in parallel with the stir. After that, as shown in FIG. 2(b), prepared silicone resin 15 is filled inside the reflector of the frame 16.

Under that condition, thermosetting is conducted to fix the fluorescent materials 12 and the diffuser 13. Thereafter, SMD is separated from the frame, thereby to obtain the semiconductor light emitting device shown in FIG. 1. If the resin is not degassed, bubbles will remain in the cured sealing resin 15, and luminous intensity of the device will decrease.

With the semiconductor light emitting device according to the instant embodiment, which is obtained by the above-explained method, emission of white light can be obtained by color mixture of red light emitd from the red fluorescent material, green light emitd from the green fluorescent material and blue light emitd from the blue fluorescent material.

The semiconductor light emitting device, using the diffuser 13 as explained above with reference to FIG. 1, can uniform the intended color tone. That is, in the light emitting device of FIG. 1, since ultraviolet emission from the semiconductor light emitting element 11 is spread in various directions by the diffuser 13, the ultraviolet emission efficiently couples to the red fluorescent material, green fluorescent material and blue fluorescent material. Additionally, emission from each fluorescent material is also spread in various directions by the diffuser 13. As a result, emission from each fluorescent material 12 is uniformly mixed with light from the other fluorescent materials 12 to produce an intended color tone. That is, it is possible to obtain a light emitting device with no irregular color visible from any view angle.

Further, in the semiconductor device of FIG. 1, since silicone resin is used as the sealing resin 15, uneven distribution of the fluorescent materials 12 is minimized, and more uniform color tone can be obtained. This is considered to be a result of the silicon resin having a higher viscosity than epoxy resin conventionally used as the sealing resin 15. Viscosity of epoxy resin is several cP, but viscosity of silicone resin is decades of cP through hundreds of cP. It is, of course, against the conventional technical knowledge because the use of the sealing resin 15 having a high viscosity is disadvantages in making it difficult to uniformly mix the fluorescent materials 12, increasing fluctuations in quantity of the sealing resin 15 upon filling the frame 16 with the sealing resin 15, and so forth. Especially when using three kinds of fluorescent materials 12 instead of only one kind of element like the device of FIG. 1, it is difficult to mix those three kinds of fluorescent materials 12 to uniform their abundance ratio. The Inventor, however, has found through experiments that distribution of fluorescent materials 12 is less variant when using silicone resin having a higher viscosity than epoxy resin. The Inventor assumes its reason as follows. When using three kinds of fluorescent materials 12 as the device of FIG. 1 does, respective RGB fluorescent materials 12 are different in gravity. Therefore, if the viscosity of the sealing resin 15 is low, heavy fluorescent materials 12 would be liable to gather downward in FIG. 1 while degassing or thermosetting the sealing resin 15 (FIG. 2(b)). However, silicone resin having a high viscosity would be unlikely to permit downward movements of fluorescent materials 12, even when they are heavy. Therefore, when using silicone resin, uneven distribution of fluorescent materials 12 would be reduced in the degassing or thermosetting process. In this manner, the advantage of silicon resin, i.e. less variant distribution of fluorescent materials 12 during degassing or thermosetting, would surpass its above-mentioned disadvantages, and this would contribute to alleviating unevenness of distribution of the fluorescent materials 12.

In addition, since the semiconductor light emitting device of FIG. 1 uses the diffuser 13, it can improve the distribution of luminous intensity so as to prevent changes in luminous intensity depending on view angles. As used here, the term "luminous intensity" pertains to luminous flux per unit solid angle propagating in a certain direction.

Moreover, since the diffuser 13 is mixed into the sealing resin 15 by the weight % concentration of 2%, the semiconductor light emitting device of FIG. 1 can enhance the luminous intensity of the device. This should be far from expectation for a person skilled in that because it has been the general belief that light emitting devices using diffusers 13 will deteriorate in luminous intensity. This is discussed below.

Most of semiconductor light emitting devices for red emission and most of those for green emission directly use red light and green light emitted from the semiconductor light emitting devices without using fluorescent materials. These devices are for monochromatic emission, and substantially from changes in color tone depending on view angles. It is of course possible that these devices suffer changes in luminous intensity with view angles. Therefore, in these devices, a diffuser was sometimes mixed into the sealing resin in order to improve the distribution of luminous intensity and thereby uniform the luminous intensity even when viewed from different angles. The quantity of the mixed diffuser normally ranged from 0.05% to 0.1% in weight % concentration because it was believed that the distribution of luminous intensity would be no more improved even by increasing the mixing amount. Thus, it has been the technical belief that mixture of a diffuser might improve the distribution of luminous intensity but would lower the luminous intensity of the device.

The Inventor, however, repeated experiments by changing various factors such as kind of semiconductor light emitting elements 11, kind of fluorescent materials 12, quantity of the diffuser 13 mixed into the sealing resin 15, and so forth. As a result, it has been found that, by mixing a diffuser 13 into a sealing resin 15 by the ratio of 2% in a device using a semiconductor light emitting element 11 for ultraviolet emission and RGB fluorescent materials 12 as shown in FIG.

1, luminous intensity of the device certainly increases. According to the Inventor's experiments, its reason can be analyzed as follows. First of all, it can be analyzed that it occurs because ultraviolet emission from the semiconductor light emitting element 11 using the diffuser 13 is spread in various directions. Due to such diffusion of ultraviolet emission, the ultraviolet emission efficiently couples to fluorescent materials 12 and enhances emission from the fluorescent materials 12. It is next analyzed that it occurs because, by mixture of an appropriate amount of the diffuser 13, the diffuser 13 intrudes into fluorescent materials 12 and has these fluorescent materials 12 diffused uniformly, thereby to make uniform gaps among respective fluorescent materials 12. The fluorescent materials 12, uniformly dispersed, can efficiently receive ultraviolet emission from the semiconductor light emitting element 11. As a result, emission from each fluorescent material 12 is enhanced, and luminous intensity of the device is enhanced as well. In contrast, if the fluorescent materials 12 do not disperse uniformly and an unevenness is produced in distribution of the fluorescent materials 12 to leave a part of the fluorescent materials 12 denser, it is difficult for the denser part of the fluorescent materials 12 to receive ultraviolet emission from the semiconductor light emitting element 11. As a result, emission of the dense part of the fluorescent materials 12 decreases, and luminous intensity of the device decreases as well. Results of careful review on quantity of the diffuser 13 will be explained later.

In the semiconductor light emitting device of FIG. 1, the use of silicone resin as the sealing resin 15 contributes to further enhancement of the luminous intensity of the device and to alleviating deterioration of the device. That is, since silicone resin 15 absorbs almost no ultraviolet emission, and does not react on ultraviolet emission, its quality is not changed by ultraviolet emission. Therefore, ultraviolet emission from the semiconductor light emitting element 11 is not absorbed by the silicone resin 15, and it excites the fluorescent materials 12 with a high efficiency. As a result, emission from the fluorescent materials 12 is enhanced, and luminous intensity of the light emitting device is enhanced as well. In contrast, epoxy resin, widely used conventionally, absorbs and reacts on ultraviolet light, and is subjected to changes such as coloring, for example. The part having changed in quality exhibits a higher absorptance to ultraviolet emission. Therefore, deterioration by ultraviolet emission is accelerated. As a result, emission luminous intensity of the device is lowered.

It has been believed heretofore that the use of silicon resin as the sealing resin 15 would lower the luminous intensity of the device because silicone resin has a high viscosity as explained above, and it is liable to generate bubbles when fluorescent materials 12 and a diffuser 13 are mixed into the silicon resin. Once bubbles are generated, they tend to remain in the sealing resin 15 when it cures (FIG. 2(b)). When bubbles remain in the sealing resin 15, light from the fluorescent materials 12 is interrupted due to a difference in refractive index between the bubbles and the sealing resin 15. Then, it has been believed that luminous intensity of the device would decrease. However, in the experiments by the Inventor, luminous intensity of the device was higher, instead, when silicone resin was used as the sealing resin 15. The Inventor understands that it is because the above-mentioned advantage of the unlikeliness to absorb ultraviolet emission surpasses the disadvantages of the likeliness of generating bubbles.

In the semiconductor light emitting device of FIG. 1, since the silicon resin 15 as the fluorescent material portion mixing the fluorescent materials 12, diffuser portion mixing the diffuser 13 and sealing resin is integrally formed, its manufacturing process is simplified.

Next discussed is quantity of the diffuser 13 to be mixed into the silicone resin 15. That is, in the instant embodiment, the diffuser 13 is mixed into the silicone resin 15 by 2% in weight % concentration, but the quantity may be changed as discussed below.

Figure 3:
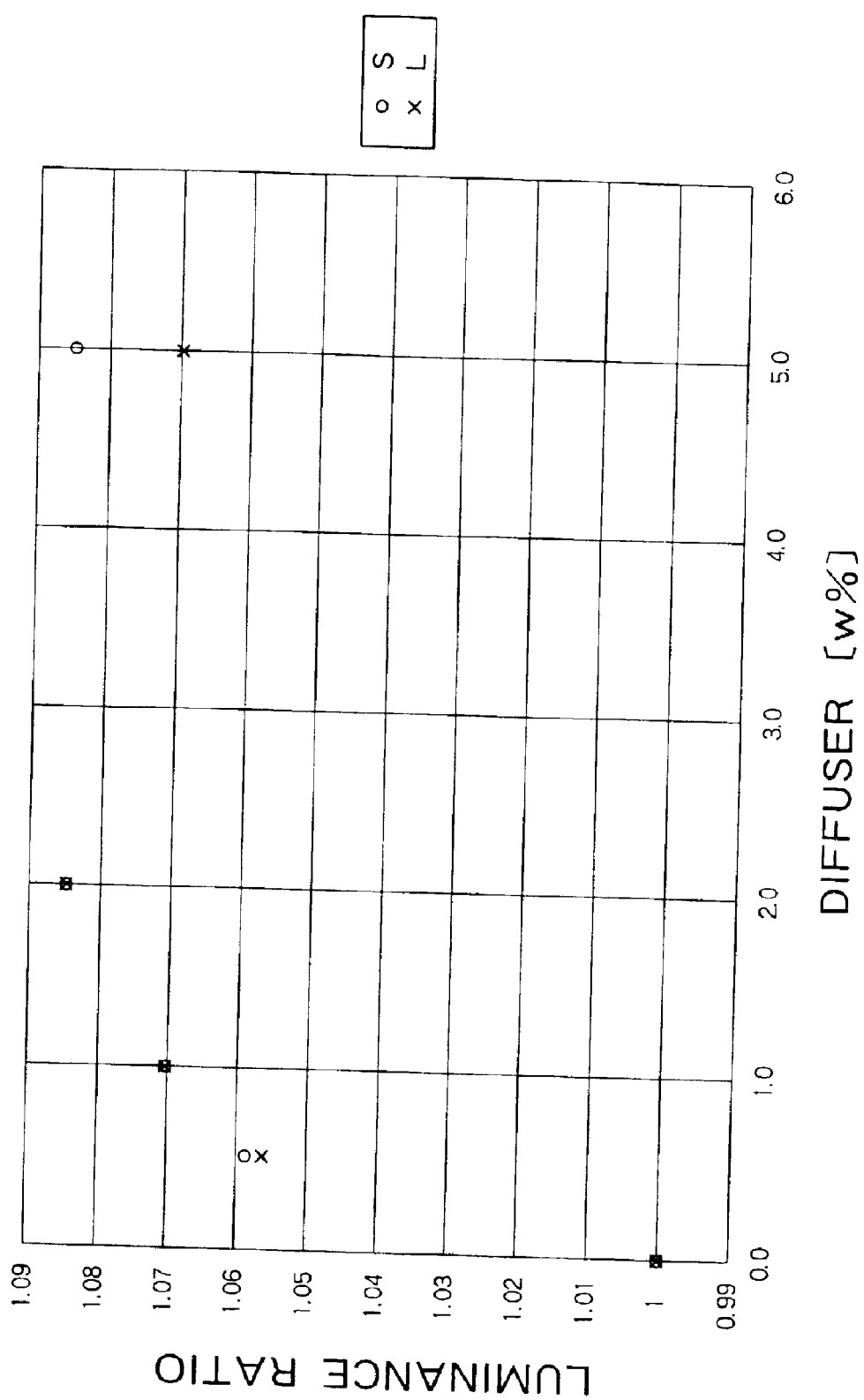
FIG. 3 is a diagram that shows a relationship between quantity of a diffuser 13 mixed into silicone resin 15 and luminous intensity of the semiconductor light emitting device according to the first embodiment of the invention.

FIG. 3 is a diagram that shows changes of luminous intensity of the semiconductor device of FIG. 1 with changes in quantity of the diffuser 13 mixed into the silicone resin 15. The abscissa indicates weight % concentration of the diffuser 13 relative to the silicone resin 15. Points S each indicate total luminous flux ø resulting from integration of the quantity of light emitted from the semiconductor light emitting device, and the ordinate indicates ratios of total luminous flux ø (relative to total luminous flux ø obtained without mixing the diffuser 13. Points L each indicate luminous intensity $I_v$ in the front direction of the semiconductor light emitting device, and the ordinate indicates ratios of luminous intensity $I_v$ relative to luminous intensity $I_v$ obtained without mixing the diffuser 13.

When the quantity of the diffuser is increased from 0.5%, to 1.0% and 2.0%, both the total luminous flux ratio S and the luminous intensity ratio L increase. For example, then the quantity of the diffuser 13 is 2.0%, both the total luminous flux ratio S and the luminous intensity ratio L are about 1.08 to 1.09. That is, by mixing the diffuser 13 into the silicon resin 15 by the ratio of 2.0%, both the total luminous flux ø and the front luminous intensity $I_v$ are raised. As apparent from FIG. 3, quantity of the diffuser 13 is preferably at least 0.5%, and more preferably at least 1%. According to the Inventor's experiments, in case the quantity of the diffuser 13 is 0.5%, 1.0% and 2.0%, respectively, almost no fluctuation was observed in total luminous flux ø, luminous intensity $I_v$ and color tone of the semiconductor light emitting device throughout the repeated experiments.

When the quantity of the diffuser is increased to 5.0%, total luminous flux ratio S does not change, but luminous intensity ratio L slightly decreases. The phenomenon can be understood to occur because the luminous intensity $I_v$ slightly decreases when the semiconductor light emitting device is viewed from the front face whereas total luminous flux ø does not change. A cause thereof would be that, when the diffuser 13 increases to 5.0%, the diffuser 13 is more difficult to be stirred in the silicone resin 15 than in the case of 2.0%, and a slight unevenness is produced in the diffuser 13.

Figure 4:
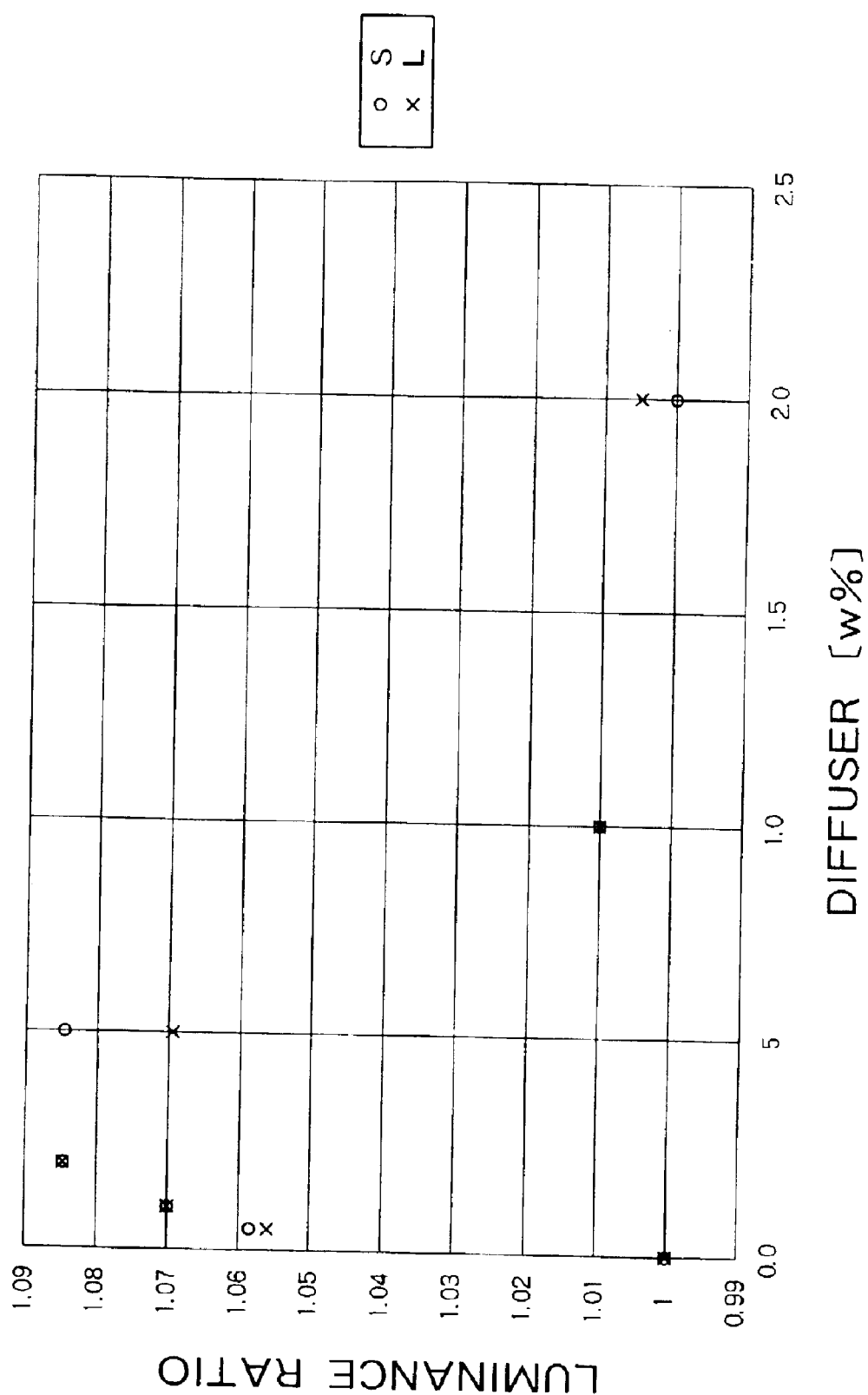
FIG. 4 is a diagram that shows a relationship between quantity of a diffuser 13 mixed into silicone resin 15 and luminous intensity of the semiconductor light emitting device according to the first embodiment of the invention.

When the quantity of the diffuser 13 was increased to 10.0%, devices were largely variant in color tone and luminous intensity, and reliable data was not obtained. This is analyzed to have derived from higher viscosity of the silicon resin than that of epoxy resin used conventionally. That is, when the diffuser 13 is increased excessively, it increases in volume, and the diffuser 13 having a small specific gravity cannot be stirred sufficiently. Then, unevenness is produced in the diffuser 13. This produces unevenness in the fluorescent materials 12 as well. As a result, fluctuation in color tone and luminous intensity among devices would be enlarged. As a reference, changes in total luminous flux ratio S and luminous intensity ratio L of the semiconductor light emitting device with changes of the quantity of the diffuser 13 to 20.0% are shown in FIG. 4. FIG. 4 shows average values obtained by repeating experiments several times. When the diffuser was mixed by 10.0%, total luminous flux ratio S and luminous intensity ratio L fluctuated among semiconductor light emitting devices from about 0.8 to 1.2, and their average was about 1.01. When the diffuser was mixed by 20.0%, fluctuation of the above-mentioned filling amount was large as well, and total luminous flux ratio S and luminous intensity ratio L fluctuated more largely. Moreover, generation of bubbles, mentioned above, also increased, and total luminous flux ratio S and luminous intensity ratio L decreased to about 1.0 in average.

As reviewed above, if the diffuser 13 is excessively increased, it cannot be stirred sufficiently in the silicone resin 15, and color tone and luminous intensity vary largely among devices. In Inventor's experiments, in order to minimize fluctuation in color tone and luminous intensity, it was preferable to limit the quantity of the diffuser 13 to or below 5.0%, and more preferably to or below 2.5%.

As reviewed above, through Inventor's experiments, it has been confirmed that quantity of the diffuser 13 mixed into the silicone resin 15 should be in the range from 0.5% to 5.0% in weight % concentration, preferably in the range from 1.0% to 2.5%, and more preferably 2.0% approximately.

(Second Embodiment)

Figure 5:
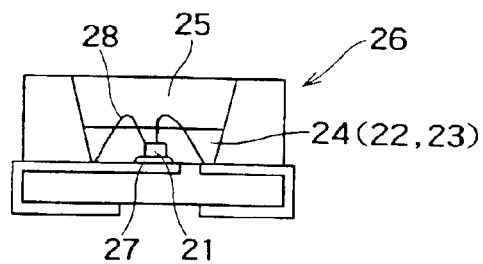
FIG. 5 is a schematic cross-sectional view of a semiconductor light emitting device according to the second embodiment of the invention.

A semiconductor light emitting device according to the second embodiment comprises, as shown in FIG. 5, a sealing resin 25, a binder 24 in which fluorescent materials 22 and a diffuser 23 are mixed, which are formed as separate elements. Configuration of the product, kind of the semiconductor light emitting element 21, kinds of the fluorescent materials 22 and kind of the diffuser 23 are the same as those of the first embodiment.

FIG. 5 is a schematic cross-sectional view of the semiconductor light emitting device according to the second embodiment. The semiconductor light emitting element 21 made of GaN materials and emitting ultraviolet light upon injection of a current is bonded inside a reflector of a frame 26 with an adhesive 27 such as silver paste. Both p and n electrodes of the semiconductor light emitting device 21 are connected to the frame 26 by a wire 28 of Au, for example. A lower portion inside the reflector of the frame 26 in the view of FIG. 5 is filled with a binder (contact-assist material, dipping material, coat material or potting material) 24. RGB fluorescent materials 22 and diffuser 23 are mixed into the binder 24. The binder 24 is commonly used as fluorescent material portion including fluorescent materials 22 and diffuser portion including the diffuser 23. The portion above the binder 24, when viewed in FIG. 5, is filled with sealing resin 25.

A manufacturing method of the semiconductor light emitting device according to the second embodiment is explained below with reference to FIGS. 6(a) through 6(f).

Figure 6:
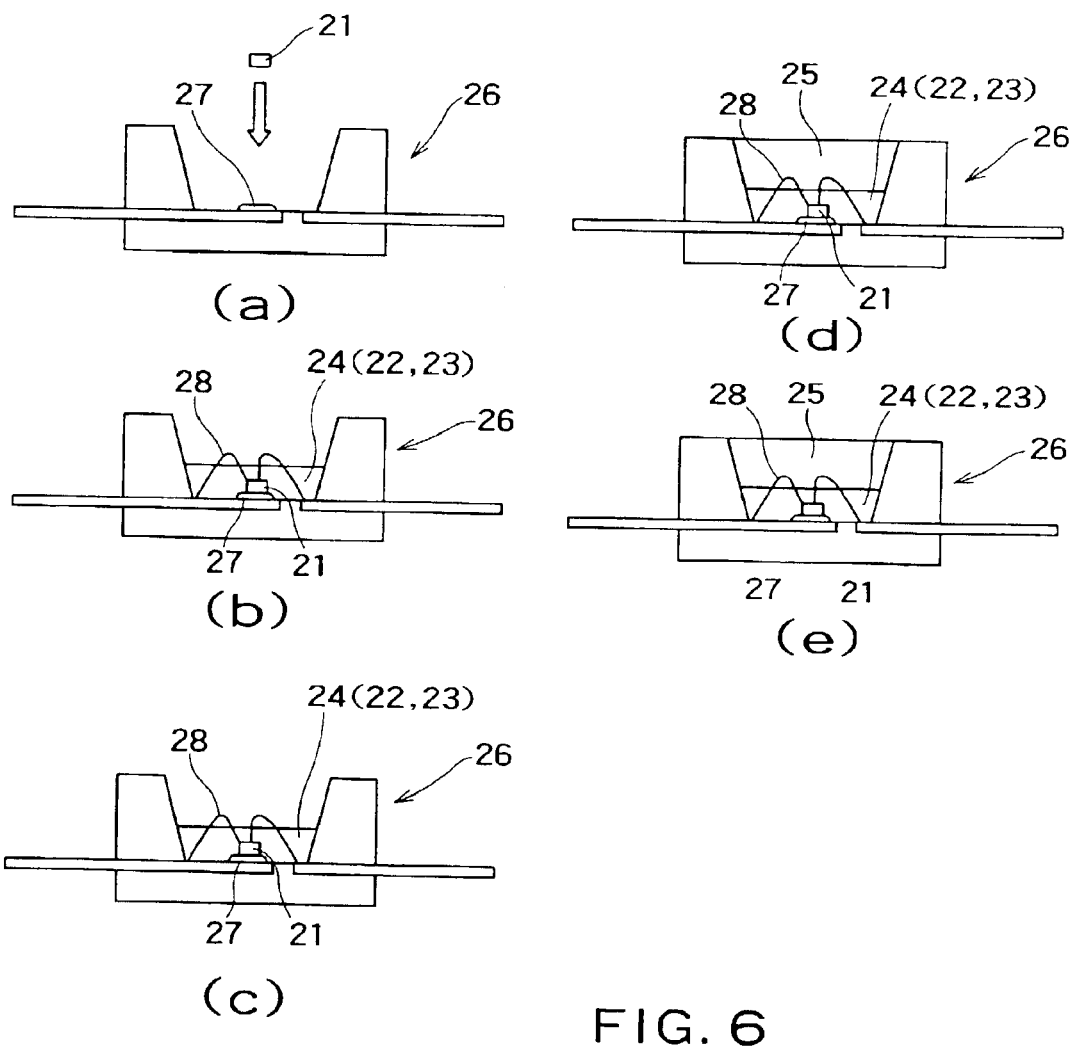
FIGS. 6(a) through 6(e) are schematic cross-sectional views that show a manufacturing method of the semiconductor light emitting device according to the second embodiment of the invention.

First as shown in FIG. 6(a), the semiconductor light emitting element 21 is fixed inside the reflector of the frame 26 by using the adhesive 27 such as silver paste.

Next as shown in FIG. 6(b), both p and n electrodes of the semiconductor light emitting element 21 are connected to the frame 26 with a wire 28. Then, predetermined compounding ratios of RGB fluorescent materials 22 and alumina powder (diffuser) 23 are mixed in the binder 24, and the preparation is stirred well to uniformly diffuse the fluorescent materials 22 and the diffuser 23. After that, as shown in FIG. 6(b), the prepared binder 24 is filled in the lower portion inside the reflector of the frame 26 when viewed in the figure.

Next as shown in FIG. 6(c), under that condition, thermosetting is conducted to fix the fluorescent materials 22 and the diffuser 23.

Next as shown in FIG. 6(d), the sealing resin 25 is filled in the upper portion inside the reflector of the frame 26.

Next as shown in FIG. 6(e), the sealing resin 25 is cured.

With the semiconductor light emitting device according to the instant embodiment, which is obtained by the above-explained method, emission of white light can be obtained by color mixture of red light emitted from the red fluorescent material, green light emitted from the green fluorescent material and blue light emitted from the blue fluorescent material.

The semiconductor light emitting device, using the diffuser 23 as explained above with reference to FIG. 5, can uniform the color tone similarly to the first embodiment (FIG. 1).

In contrast, conventional light emitting devices not using the diffuser 23 involved the problem that color tone changes with view angles. There are two major reasons of that problem. First, when using three kinds of fluorescent materials 22 as the instant embodiment does, it is more difficult to mix those three kinds of fluorescent materials 12 to uniform their abundance ratio and the abundance ratio is more likely to become uneven as compared with cases using only one kind of fluorescent material. For example, in a portion with a larger amount of R fluorescent material, for example, color tone approaches red. Second, even if those three kinds of fluorescent materials 21 are mixed uniformly, since they are different in specific gravity, heavier fluorescent materials 21 gather in a lower portion in the thermosetting process of the binder 24 containing the fluorescent materials 21. For example, when the red fluorescent material is the heaviest, the red fluorescent material gathers in the lower portion. As a result, light from the semiconductor light emitting element first passes through the red fluorescent material portion abundant in red fluorescent material. Therefore, when viewed from the front face of the light emitting device, thickness of the red fluorescent material portion the light from the light emitting element pass through is thinned, and the color tone becomes closer to blue or green. To the contrary, when the light emitting device is viewed from an angle deviated toward the side wall, the red fluorescent material portion the light from the light emitting element passes through becomes thicker, and the color tone approaches red.

In contrast, in the light emitting device according to the instant embodiment, using the diffuser 23, the color tone can be uniformed. That is, in the light emitting device shown here, since ultraviolet emission from the semiconductor light emitting element 21, red, green and blue emission from the fluorescent materials 22 are spread in various directions inside the reflector of the frame 26 by the diffuser 23, extracted light can be regarded as an even light source departing from the top surface of the binder 24, and the color tone is uniformed. That is, a light emitting device without color irregularity from any view angle can be obtained.

Additionally, with the semiconductor light emitting device of FIG. 5, using the diffuser 23, luminous intensity of the device can be increased similarly to the first embodiment (FIG. 1).

In the semiconductor light emitting device of FIG. 5 explained above, silicone resin or other resin can be used as the binder 24.

(Modifications of the Second Embodiment)

Figure 7:
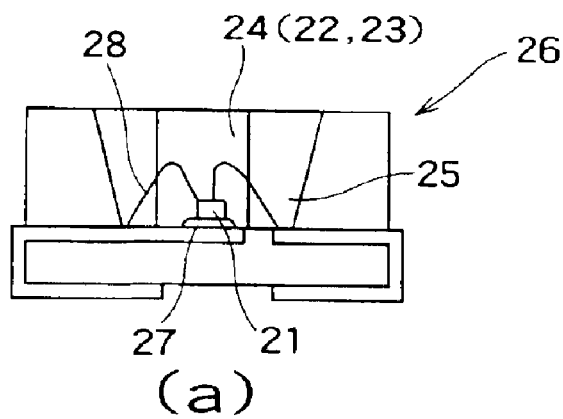
FIGS. 7(a) and 7(b) are schematic cross-sectional views that show modifications of the second embodiment of the invention.
Figure 7:
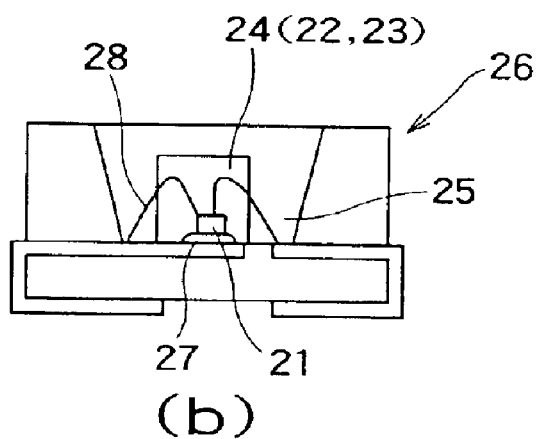

FIGS. 7(a) and 7(b) are schematic cross-sectional views that show modifications of the second embodiment of the invention. These modifications are different from the second embodiment in shape of the binder 24 and the sealing resin 25.

In the light emitting device of FIG. 7(a), the binder 24 containing the diffuser 23 and the fluorescent materials 22 has a cylindrical shape, and the sealing resin 25 is buried around it.

In the light emitting device of FIG. 7(b), the binder 24 containing the diffuser 23 and the fluorescent materials 22 has a cylindrical shape, and the sealing resin 25 is buried on the top and around it.

In the devices of FIGS. 7(a) and 7(b), silicon resin or other resin may be used as the binder 24.

The binder 24 and the sealing resin 25 may be shaped as the second embodiment, depending upon their materials and the way of use of the light emitting device. Also with these modifications, the same effects as those of the second embodiment can be obtained.

(Third Embodiment)

Figure 8:
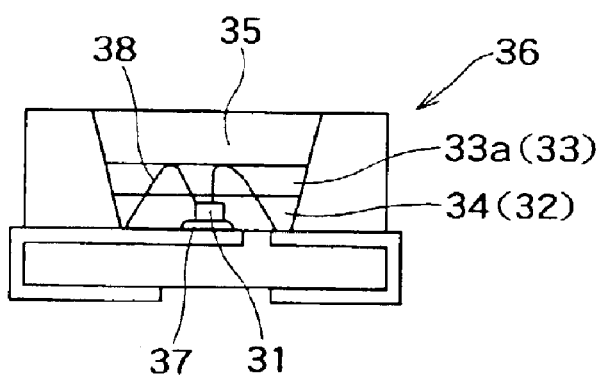
FIG. 8 is a schematic cross-sectional view of a semiconductor light emitting device according to the third embodiment of the invention.

A semiconductor light emitting device according to the third embodiment comprises, as shown in FIG. 8, a binder 34 in which fluorescent materials 32, an adherent or cohesive medium 33a in which a diffuser 33 is mixed, and sealing resin 35, which are formed as separate elements. Configuration of the product, kind of the semiconductor light emitting element 31, kinds of the fluorescent materials 32 and kind of the diffuser 33 are the same as those of the second embodiment.

FIG. 8 is a schematic cross-sectional view of the semiconductor light emitting device according to the third embodiment. The semiconductor light emitting element 31 made of GaN materials and emitting ultraviolet light upon injection of a current is bonded inside a reflector of a frame 36 with an adhesive 37 such as silver paste. Both p and n electrodes of the semiconductor light emitting device 31 are connected to the frame 36 by a wire 38 of Au, for example. A lower portion inside the reflector of the frame 36 in the view of FIG. 8 is filled with a binder 34. RGB fluorescent materials 32 are mixed into the binder 34. The portion above the binder 34, when viewed in FIG. 8, is filled with the adherent or coherent medium 33a. The medium 33a contains the diffuser 33. The portion above the medium 33a is filled with the sealing resin 35.

The manufacturing method recommended for manufacturing the semiconductor light emitting device of FIG. 8 is substantially the same as that explained with reference to the second embodiment (FIGS. 6(a) through 6(e)), and its explanation is omitted here.

The semiconductor light emitting device of FIG. 8, using the diffuser 33, can uniform the color tone similarly to the first embodiment (FIG. 1).

In addition, since the medium 33a containing the diffuser 33 is separately prepared from the binder 34 containing the fluorescent materials 32, the semiconductor light emitting device of FIG. 8 can especially alleviate uneven distribution of the diffuser 33.

(Fourth Embodiment)

Figure 9:
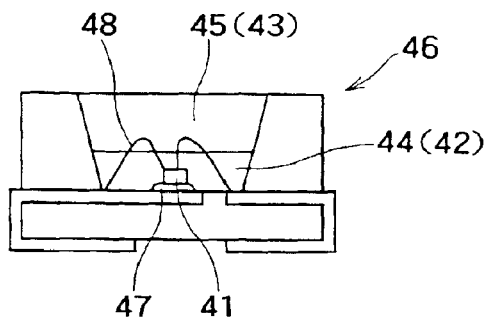
FIG. 9 is a schematic cross-sectional view of a semiconductor light emitting device according to the fourth embodiment of the invention.

A semiconductor light emitting device according to the third embodiment comprises, as shown in FIG. 9, a binder 44 containing fluorescent materials 42, and a sealing resin 45 containing a diffuser 43, which are formed as separate elements. Configuration of the product, kind of the semiconductor light emitting element 41, kinds of the fluorescent materials 42 and kind of the diffuser 43 are the same as those of the first embodiment (FIG. 1).

FIG. 9 is a schematic cross-sectional view of the semiconductor light emitting device according to the fourth embodiment. The semiconductor light emitting element 41 made of GaN materials and emitting ultraviolet light upon injection of a current is bonded inside a reflector of a frame 46 with an adhesive 47 such as silver paste. Both p and n electrodes of the semiconductor light emitting device 41 are connected to the frame 46 by a wire 48 of Au, for example. A lower portion inside the reflector of the frame 46 in the view of FIG. 9 is filled with a binder 44. RGB fluorescent materials 42 are mixed into the binder 44. The portion above the binder 44, when viewed in FIG. 9, is filled with the sealing resin 45. The diffuser is mixed into the sealing resin 45.

The semiconductor light emitting device of FIG. 9, using the diffuser 43, can uniform the color tone similarly to the first embodiment (FIG. 1).

In addition, since the sealing resin 45 containing the diffuser 43 and the binder 44 containing the fluorescent materials 42 are prepared separately from each other, unevenness of the diffuser 43 can be alleviated similarly to the third embodiment (FIG. 8).

Since the semiconductor light emitting device of FIG. 9 is different from the semiconductor light emitting device according to the third embodiment (FIG. 8) in position containing the diffuser 43, their emission patterns are slightly different, and these devices can be selectively used depending on the way of use of the lamp.

In the semiconductor light emitting device of FIG. 9, silicone resin used in the first embodiment (FIG. 1) can be used as the sealing resin 45.

(Modifications of the Fourth Embodiment)

FIGS. 10(a) through 10(d) are schematic cross-sectional views that show modifications of the semiconductor light emitting device according to the fourth embodiment. The modifications are different from the fourth embodiment in shape of the binder 54 and the sealing resin 55.

Figure 10:
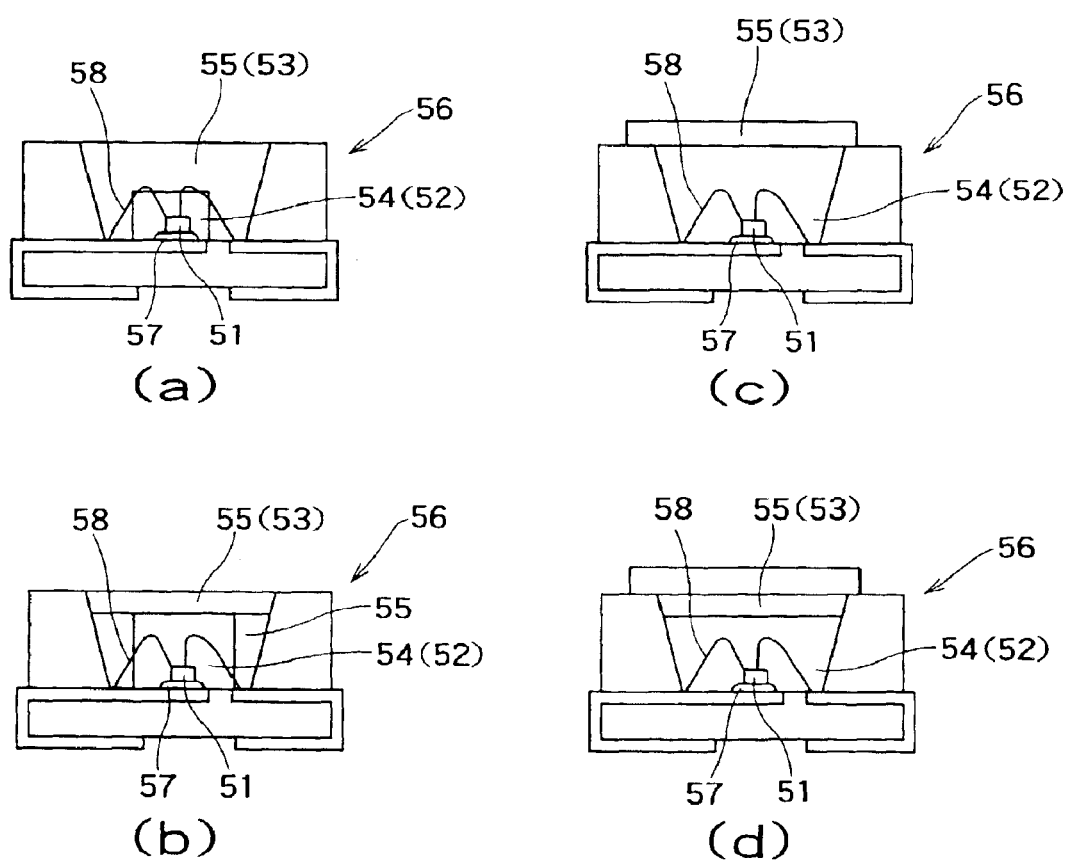
FIGS. 10(a) through 10(d) are schematic cross-sectional views that show modifications of the fourth embodiment of the invention.

In the semiconductor light emitting device of FIG. 10(a), the binder 54 containing fluorescent materials 52 has a cylindrical shape, and the sealing resin 55 is buried on and around it.

In the semiconductor light emitting device of FIG. 10(b), the binder 54 containing fluorescent materials 52 has a cylindrical shape, it is fixed by the sealing resin 55 surrounding it, and the sealing resin 55 containing the diffuser 53 is buried on it.

In the semiconductor light emitting device of FIG. 10(c), the binder 54 containing fluorescent materials 52 is filled inside the reflector of the frame 56, and the sealing resin 55 containing the diffuser 53 is coated right above the reflector.

In the semiconductor light emitting device of FIG. 10(d), quantity of the binder 54 containing the fluorescent materials 52 is increased whereas quantity of the sealing resin 55 containing the diffuser 53 is decreased.

In the semiconductor light emitting devices of FIGS. 10(a) through 10(d), a resin can be used as the binder 54.

The binder 54 and the sealing resin 55 may be shaped as the fourth embodiment, depending upon their materials and the way of use of the light emitting device. Also with these modifications, the same effects as those of the fourth embodiment can be obtained.

(Fifth Embodiment)

Figure 11:
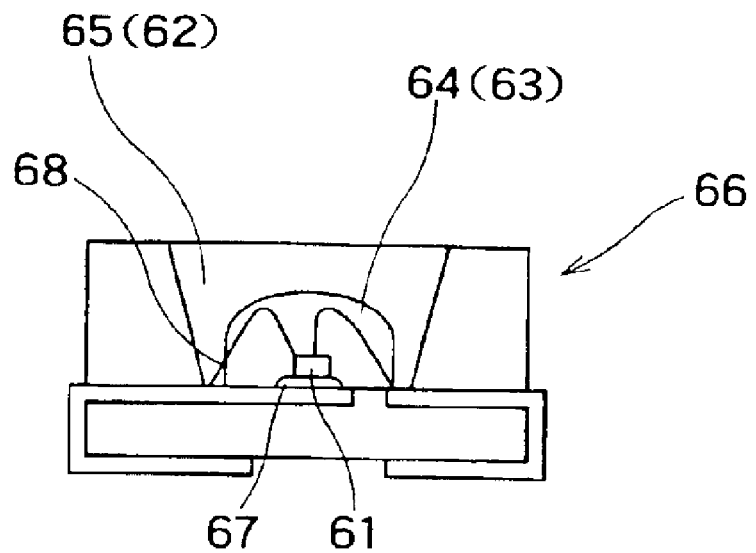
FIG. 11 is a schematic cross-sectional view of a semiconductor light emitting device according to the fifth embodiment of the invention.

A semiconductor light emitting device according to the fifth embodiment comprises, as shown in FIG. 11, a binder 64 containing a diffuser 63 and a sealing resin 65 containing fluorescent materials 62, which are formed as separate elements. Configuration of the product, kind of the semiconductor light emitting element 61, kinds of the fluorescent materials 62 and kind of the diffuser 63 are the same as those of the first embodiment (FIG. 1).

FIG. 11 is a schematic cross-sectional view of the semiconductor light emitting device according to the fifth embodiment. The semiconductor light emitting element 61 made of GaN materials and emitting ultraviolet light upon injection of a current is bonded inside a reflector of a frame 66 with an adhesive 67 such as silver paste. Both p and n electrodes of the semiconductor light emitting device 61 are connected to the frame 66 by a wire 68 of Au, for example. The binder 64 is buried around the semiconductor light emitting element 61. The diffuser 63 is mixed in the binder 64. The space around the binder 64 is filled with the sealing resin 65. The sealing resin 65 contains RGB fluorescent materials 62.

The manufacturing method recommended for manufacturing the semiconductor light emitting device of FIG. 11 is substantially the same as that explained with reference to the second embodiment (FIGS. 6(a) through 6(e)), and its explanation is omitted here.

The device according to the instant embodiment is slightly inferior to the first to fourth embodiments from the viewpoint of uniforming the color tone, but it is especially excellent in effect of enhancing the emission intensity. Its reason will be as follows. That is, when using a semiconductor light emitting element 61 for ultraviolet emission, reflectors in conventional devices were liable to partly absorb ultraviolet emission without reflecting it sufficiently. Therefore, ultraviolet emission in horizontal directions from the semiconductor light emitting element 61 was often absorbed before exciting fluorescent materials 62. In contrast, in the light emitting device of FIG. 11, using the diffuser 63, it is assumed that ultraviolet emission in horizontal directions is spread vertically by the diffuser 63, then efficiently couples to the fluorescent materials 62, and thereby enhances the emission intensity. Furthermore, since light from the fluorescent materials 62 is partly diffused by the diffuser 63, the device shown here is also effective to uniform the color tone.

(Modification of the Fifth Embodiment)

Figure 12:
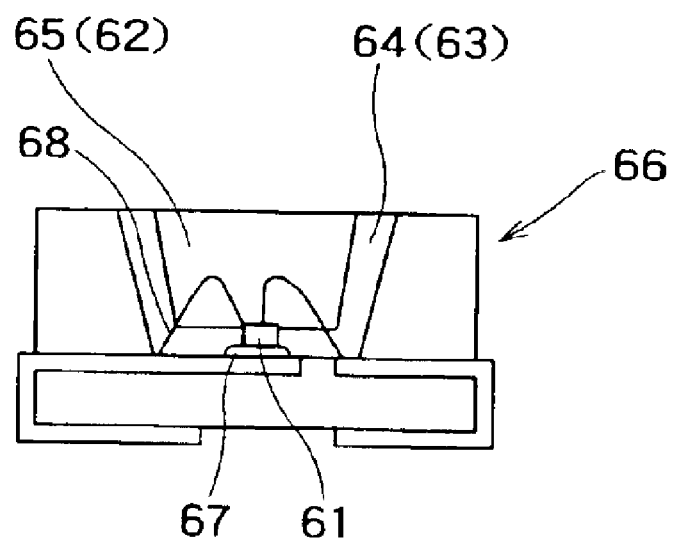
FIG. 12 is a schematic cross-sectional view that shows a modification of the fifth embodiment of the invention.

FIG. 12 is a schematic cross-sectional view of a modification of the semiconductor light emitting device according to the fifth embodiment. The modification is different from the fifth embodiment in shape of the binder 64 and the sealing resin 65.

In the semiconductor light emitting device of FIG. 12, the binder 64 containing the diffuser 63 is coated substantially uniformly on the inner wall of the reflector, and the sealing resin 65 containing fluorescent materials 62 is buried above it.

The binder 64 and the sealing resin 65 may be shaped as shown in FIG. 12, depending upon their materials and the way of use of the light emitting device. This modified device also ensures the same effects as those of the fifth embodiment.

(Sixth Embodiment)

Figure 13:
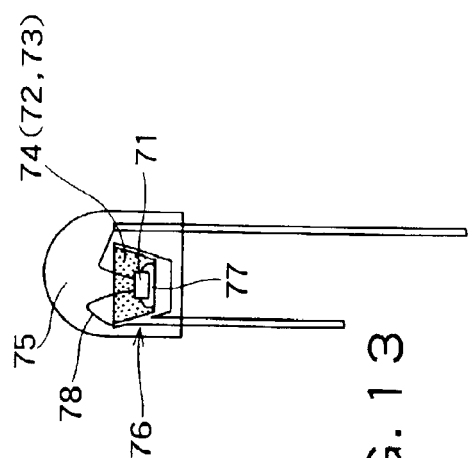
FIG. 13 is a schematic cross-sectional view of a semiconductor light emitting device according to the sixth embodiment of the invention.

The semiconductor light emitting device according to the sixth embodiment is one called LED lamp for white emission as shown in FIG. 13. Here is used an element made of GaN materials and emitting blue light in response to an injected current as a semiconductor light emitting element 71. Used as fluorescent materials 72 are YAG fluorescent materials excited by blue emission to emit yellow light. Used as a diffuser 73 is calcium carbonate powder. In the device of FIG. 13, the fluorescent materials 72 and the diffuser 73 are mixed in the binder 74.

The embodiment is explained below in greater detail. FIG. 13 is a schematic cross-sectional view of the semiconductor light emitting device according to the sixth embodiment of the invention. The semiconductor light emitting element 71 made of GaN materials and emitting ultraviolet light upon injection of a current is bonded inside a reflector of a frame 76 with an adhesive 77 such as silver paste. Both p and n electrodes of the semiconductor light emitting device 71 are connected to the frame 76 by a wire 78 of Au, for example. Interior of the reflector of the frame 76 is filled with the binder 74. The YAG fluorescent materials 72 and the diffuser 73 are mixed in the binder 74. In the device of FIG. 13, the binder 74 is commonly used as fluorescent material portion including fluorescent materials 72 and diffuser portion including the diffuser 73.

A manufacturing method of the LED lamp shown in FIG. 13 is explained with reference to FIGS. 14A through 14F.

Figure 14A:
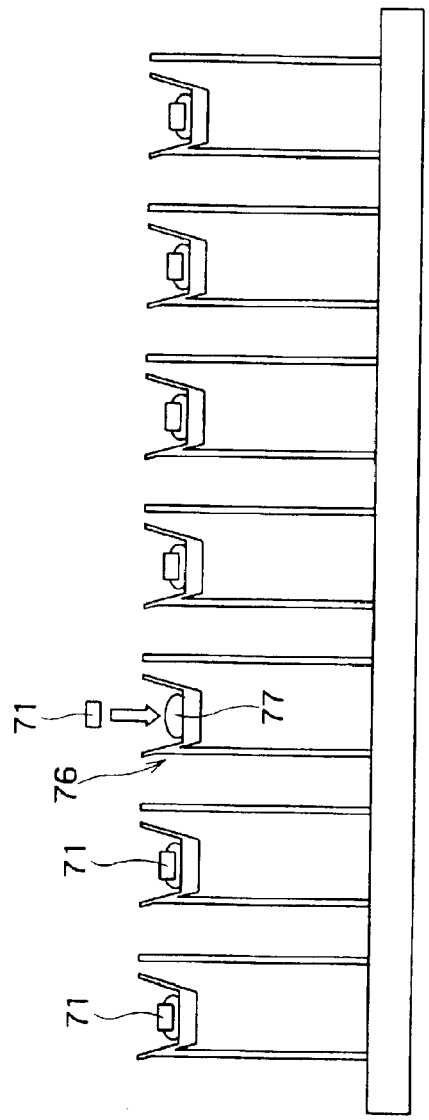
FIG. 14A is a schematic cross-sectional view that shows a manufacturing method of the semiconductor light emitting device according to the sixth embodiment of the invention.

First as shown in FIG. 14A, the semiconductor light emitting element 71 is fixed inside the reflector of each frame 76 by using the adhesive 77 such as silver paste.

Figure 14B:
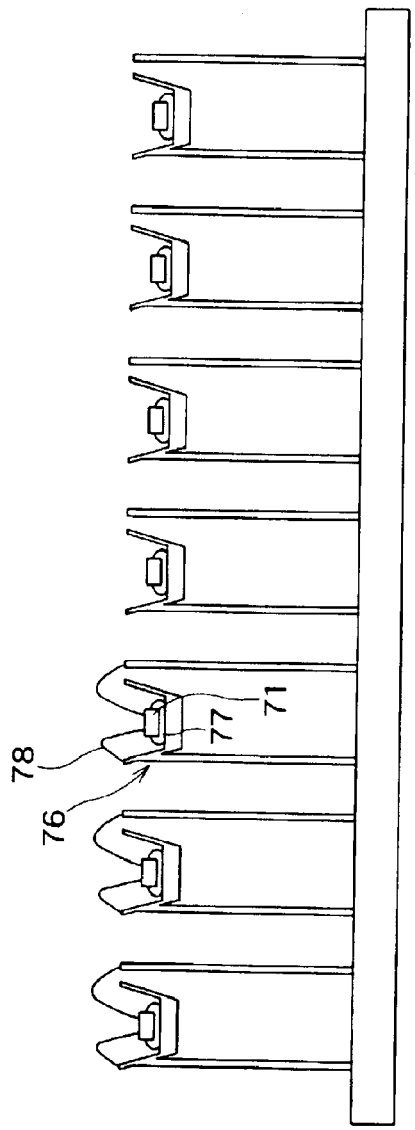
FIG. 14B is a schematic cross-sectional view, following to FIG. 14A, which shows the manufacturing method of the semiconductor light emitting device according to the sixth embodiment of the invention.

Next as shown in FIG. 14B, both p and n electrodes of the semiconductor light emitting element 71 are connected to the frame 76 with a wire 78.

Figure 14C:
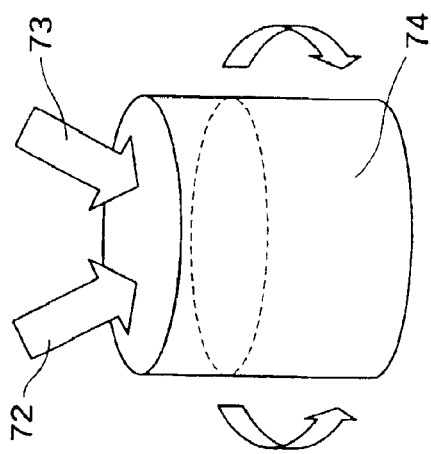
FIG. 14C is a schematic cross-sectional view, following to FIG. 14B, which shows the manufacturing method of the semiconductor light emitting device according to the sixth embodiment of the invention.

Next as shown in FIG. 14C, predetermined compounding ratios of YAG fluorescent materials 72 and calcium carbonate powder (diffuser) 73 are mixed in the binder 74, and the preparation is stirred well to uniformly diffuse the fluorescent materials 72 and the diffuser 73.

Figure 14D:
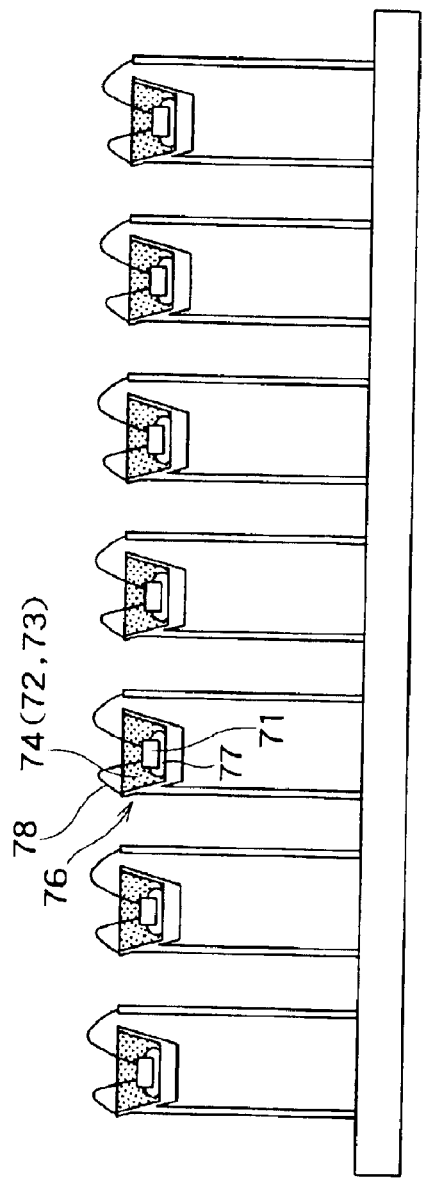
FIG. 14D is a schematic cross-sectional view, following to FIG. 14C, which shows the manufacturing method of the semiconductor light emitting device according to the sixth embodiment of the invention.

Next as shown in FIG. 14D, the prepared binder 74 is filled inside each reflector. Under the condition, thermosetting is conducted to fix the fluorescent materials 72 and the diffuser 73.

Figure 14E:
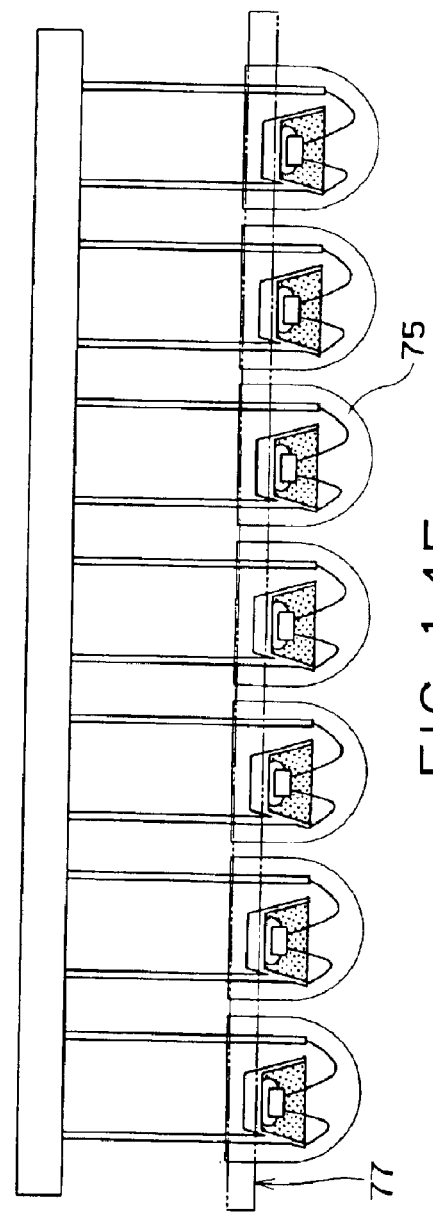
FIG. 14E is a schematic cross-sectional view, following to FIG. 14D, which shows the manufacturing method of the semiconductor light emitting device according to the sixth embodiment of the invention.

Next as shown in FIG. 14E, the sealing resin 75 is filled and cured in a case mold 79 having a configuration usable as a lens as well. Reference numerals already shown in FIG. 14D are omitted from FIG. 14E for easier view of the figure.

Figure 14F:
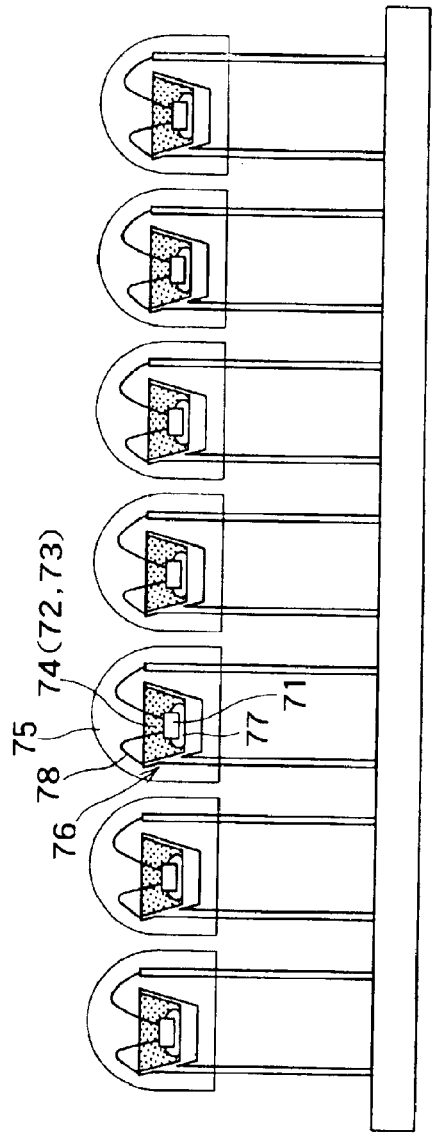
FIG. 14F is a schematic cross-sectional view, following to FIG. 14E, which shows the manufacturing method of the semiconductor light emitting device according to the sixth embodiment of the invention.

Next as shown in FIG. 14F, the case mold 79 is removed. After that, the frames 76 are separated to those of discrete LED lamps. Thus the device of FIG. 13 is obtained.

With the semiconductor light emitting device according to the instant embodiment, which is obtained by the above-explained method, emission of white light can be obtained by color mixture of blue light from the semiconductor light emitting element 71 and yellow light from the YAG fluorescent materials 72 excited by emission of the blue light.

Conventional semiconductor light emitting devices not using the diffuser 73 involved the problem that color tone slightly changes with view angles due to unevenness in thickness of the fluorescent material portion 74 the blue light from the semiconductor light emitting element passes through. For example, when the light emitting device is viewed from the front face, since the fluorescent material portion 74 is thin at the part thereof through which the blue light from the semiconductor light emitting passes, and the color tone becomes closer to blue. However, when the light emitting device is viewed from an angle deviated toward its side face, the fluorescent material portion 74 is thicker in the part thereof through which the blue light passes, and the color tone approaches yellow.

In contrast, in the semiconductor light emitting device of FIG. 13, using the diffuser 73, the color tone can be uniformed from any view angles. That is, in the semiconductor light emitting device of FIG. 13, since blue emission from the semiconductor light emitting element 71 and yellow light from the YAG fluorescent materials 72 can be spread in various directions inside the reflector of the frame 76, extracted light can be regarded as an even light source departing from the top surface of the reflector, and the color tone is uniformed. That is, a light emitting device without color irregularity from any view angle can be obtained.

Additionally, in the semiconductor light emitting device of FIG. 13, quantity of the fluorescent materials 72 required for obtained the same color tone as that of a device not using the diffuser 73 can be reduced. Its reason can be analyzed as follows. That is, in the semiconductor light emitting device of FIG. 13 using the diffuser 73, the blue emission from the semiconductor light emitting element 71 would be spread and efficiently couple to the YAG fluorescent materials 72 inside the reflector of the frame 76, and therefore, intensive emission from the YAG fluorescent materials 72 can be obtained.

Furthermore, in the semiconductor light emitting device of FIG. 13, luminous intensity of emission can be improved as compared with devices not using the diffuser 73. Its reason is analyzed to lie in that efficient coupling of the blue emission from the semiconductor light emitting element 71 and the YAG fluorescent materials 72 makes it possible to efficiently use the blue emission from the semiconductor light emitting element 71 and the yellow emission from the YAG fluorescent materials 72.

(Seventh Embodiment)

Figure 15:
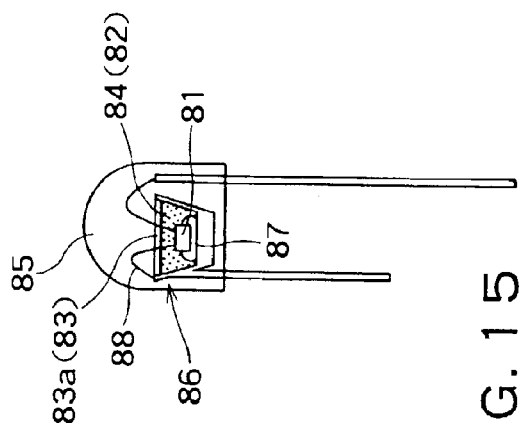
FIG. 15 is a schematic cross-sectional view of a semiconductor light emitting device according to the seventh embodiment of the invention.

As shown in FIG. 15, a semiconductor light emitting device according to the seventh embodiment comprises a binder 84 containing fluorescent materials 82 and a medium 83*a* containing a diffuser 83, which are formed as separate elements. Configuration of the product, kind of the semiconductor light emitting element 81, kinds of the fluorescent materials 82 and kind of the diffuser 83 are the same as those of the sixth embodiment (FIG. 13).

FIG. 15 is a schematic cross-sectional view of the semiconductor light emitting device according to the seventh embodiment of the invention. The semiconductor light emitting element 81 made of GaN materials and emitting ultraviolet light upon injection of a current is bonded inside a reflector of a frame 86 with an adhesive 87 such as silver paste. Both p and n electrodes of the semiconductor light emitting device 81 are connected to the frame 86 by a wire 88 of Au, for example. Interior of the reflector of the frame 86 is filled with the binder 84. The YAG fluorescent materials 82 are mixed in the binder 84. Right above the reflector of the frame 86, the medium 83*a*, either adherent or coherent, containing the diffuser 83 is coated. Then the sealing resin 85 covers them all.

A manufacturing method of the semiconductor light emitting device according to the seventh embodiment is explained below with reference to FIGS. 16A through 16F.

First as shown in FIG. 16A, the semiconductor light emitting element 81 is fixed inside the reflector of each frame 86 by using the adhesive 87 such as silver paste.

Next as shown in FIG. 16B, both p and n electrodes of the semiconductor light emitting element 81 are connected to the frame 86 with a wire 88.

After that, the YAG fluorescent materials 82 are introduced into the binder 84, and they are stirred well to uniformly diffuse the fluorescent materials 82. Thereafter, as shown in FIG. 16C, the prepared binder 84 is filled inside the reflector of the frame 86, and under the condition, thermosetting is conducted to fix the fluorescent materials 82.

Figure 16E:
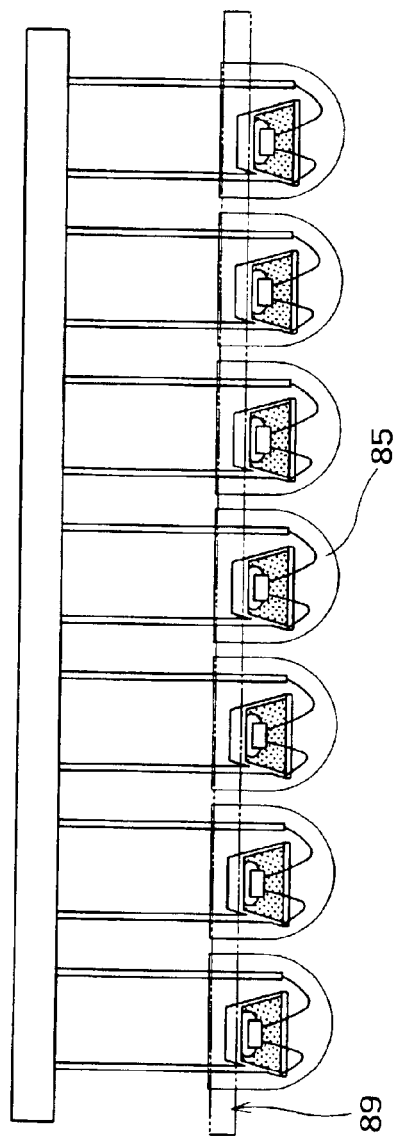
FIG. 16E is a schematic cross-sectional view, following to FIG. 16D, which shows the manufacturing method of the semiconductor light emitting device according to the seventh embodiment of the invention.

Subsequently, the diffuser 83 is introduced into the adherent or coherent medium 83*a*, and they are stirred well to uniformly diffuse the diffuser 83. Then, as shown in FIG. 16D, the prepared medium 83*a* is coated right above the reflector, and under the condition, it is dried to fix the diffuser 83. Reference numerals already shown in FIG. 16C are omitted from FIG. 16D and the next FIG. 16E for easier view of the figures.

Next as shown in FIG. 16E, the sealing resin 85 is filled and cured in a case mold 89 having a configuration useable as a lens as well.

Figure 16F:
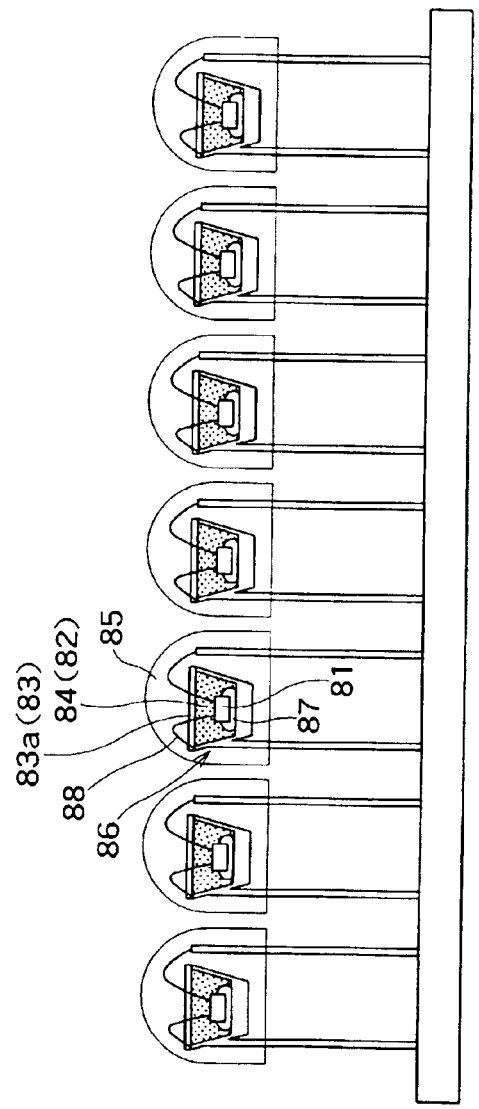
FIG. 16F is a schematic cross-sectional view, following to FIG. 16E, which shows the manufacturing method of the semiconductor light emitting device according to the seventh embodiment of the invention.

Next as shown in FIG. 16F, the case mold 89 is removed.

After that, the frames 86 are separated to those of discrete LED lamps. Thus the device of FIG. 15 is obtained.

Figure 16G:
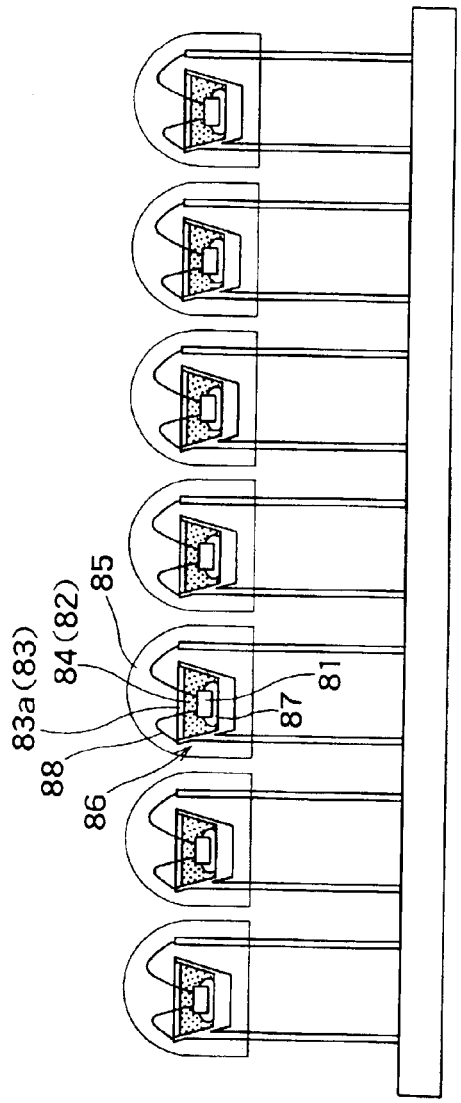
FIG. 16G is a schematic cross-sectional view, following to FIG. 16F, which shows the manufacturing method of the semiconductor light emitting device according to the seventh embodiment of the invention.

The manufacturing method explained here can be modified by reducing the quantity of the binder 84 such that the medium 83*a* is limited within the reflector of the frame 86 as shown in FIG. 16G.

With the semiconductor light emitting device of FIG. 15, which is obtained by the above-explained method, emission of white light can be obtained by color mixture of blue light from the semiconductor light emitting element 81 and yellow light from the YAG fluorescent materials 82 excited by emission of the blue light.

The semiconductor light emitting device of FIG. 15, using the diffuser 83, can uniform the color tone. That is, in the light emitting device of FIG. 15, since blue emission from the semiconductor light emitting element 81 and yellow light from the YAG fluorescent materials 82 are spread in various directions by the diffuser 83 just above the reflector of the frame 86, extracted light can be regarded as an even light source departing from the top surface of the medium 83*a*, and the color tone is uniformed. That is, a light emitting device without color irregularity from any view angle can be obtained.

Additionally, in the semiconductor light emitting device of FIG. 15, since the binder 84 containing the fluorescent materials 82 and the medium 83*a* containing the diffuser 83 are prepared as separate elements, unevenness of the fluorescent materials 82 and the diffuser 83 can be minimized.

(Eighth Embodiment)

The semiconductor light emitting device according to the eighth embodiment comprises a binder 94 containing fluorescent materials 92 and a sealing resin 95 containing a diffuser 93, which are formed as separate elements. Configuration of the product, kind of the semiconductor light emitting element 91, kinds of the fluorescent materials 92 and kind of the diffuser 93 are the same as those of the sixth embodiment (FIG. 13).

Figure 17:
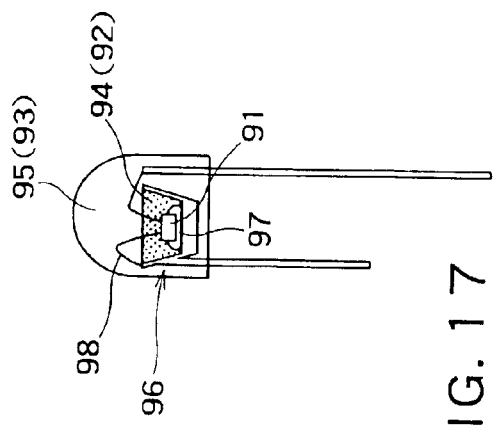
FIG. 17 is a schematic cross-sectional view of a semiconductor light emitting device according to the eighth embodiment of the invention.

FIG. 17 is a schematic cross-sectional view of the semiconductor light emitting device according to the eighth embodiment of the invention. The semiconductor light emitting element 91 made of GaN materials and emitting ultraviolet light upon injection of a current is bonded inside a reflector of a frame 96 with an adhesive 97 such as silver paste. Both p and n electrodes of the semiconductor light emitting device 91 are connected to the frame 96 by a wire 98 of Au, for example. Interior of the reflector of the frame 96 is filled with the binder 94. The YAG fluorescent materials 92 are mixed in the binder 94. The diffuser 93 is mixed in the sealing resin 95.

The manufacturing method recommended for manufacturing the semiconductor light emitting device of FIG. 17 is substantially the same as that explained with reference to the sixth embodiment (FIGS. 14A through 14E), and its explanation is omitted here.

The semiconductor light emitting device of FIG. 17, using the diffuser 93, can uniform the color tone similarly to the seventh embodiment (FIG. 15).

Additionally, in the semiconductor light emitting device of FIG. 17, since the binder 94 containing the fluorescent materials 92 and the sealing resin 95 containing the diffuser 93 are prepared as separate elements, unevenness of the fluorescent materials 92 and the diffuser 93 can be minimized.

Since the semiconductor light emitting device of FIG. 17 and the semiconductor light emitting device according to the seventh embodiment (FIG. 15) are different in position containing the diffuser 93, their emission patterns are slightly different, and these devices can be selectively used depending on the way of use of the lamp.

(Ninth Embodiment)

The semiconductor light emitting device according to the ninth embodiment is a version modified from the semiconductor light emitting device according to the first embodiment (FIG. 1) in kinds of fluorescent materials 12 and kinds of diffuser 13. More specifically, used as the fluorescent materials 12 are a blue fluorescent material excited by ultraviolet emission from the semiconductor light emitting element 11 to emit blue light, a YAG fluorescent material excited by blue emission from the blue fluorescent material to emit yellow light, and a red fluorescent material excited by ultraviolet emission from the semiconductor light emitting element 11 to emit red light. Used as the diffuser 12 is silica powder.

With the light emitting device according to the instant embodiment, emission of white light can be obtained by color mixture of red light emitd from the red fluorescent material, blue light emitd from the blue fluorescent material, and yellow light emitd from the YAG fluorescent material.

The light emitting device according to the instant embodiment also ensured the same effects as those of the semiconductor light emitting device according to the first embodiment (FIG. 1).

(Tenth Embodiment)

The semiconductor light emitting device according to the tenth embodiment is a version modified from the semiconductor light emitting device according to the fourth embodiment (FIG. 9) in kinds of fluorescent materials 42. More specifically, used as the fluorescent materials 42 are a blue fluorescent material excited by ultraviolet emission from the semiconductor light emitting element 41 to emit blue light and a YAG fluorescent material excited by the blue fluorescent material to emit yellow light.

With the light emitting device according to the instant embodiment, emission of white light can be obtained by color mixture of blue light emitd from the blue fluorescent material and yellow light emitd from the YAG fluorescent material. Regarding semiconductor light emitting devices using two kinds of fluorescent materials 42 as the instant embodiment does, conventional semiconductor light emitting devices not using the diffuser 43 involved the problem of changed in color tone depending on view angles for the same reason as already explained with reference to the second embodiment (FIG. 5) using three kinds of fluorescent materials 22.

In contrast, the semiconductor light emitting device according to the present embodiment can uniform the color tone by using the diffuser 43. That is, in the semiconductor light emitting device according to the instant embodiment, since blue light from the blue fluorescent material and yellow light from the YAG fluorescent material are spread in various directions inside the reflector of the frame 46, extracted light can be regarded as an even light source departing from the top surface of the reflector, and the color tone is uniformed. That is, a light emitting device without color irregularity from any view angle can be obtained.

Heretofore, preferred embodiments have been described as using a semiconductor light emitting device made of GaN materials. However, the same effects are obtained also when using a SiC or BN semiconductor light emitting element. The diffuser is not limited to those indicated in respective embodiments, and any other can be selected as far as the same effects can be obtained. Also about configuration of the products, it is not limited to SMD or LED lamp.

What is claimed is:

1. A semiconductor light emitting device comprising:

a semiconductor light emitting element which emits light of a first wavelength when a current is injected thereto; and a sealing resin which contains in mixture a fluorescent material and a diffuser, said fluorescent material being excited by light of the first wavelength to emit light of a second wavelength, and weight % concentration of said diffuser in said sealing resin is in the range from 0.5% to 5.0%.

2. The semiconductor light emitting device according to claim 1 wherein said diffuser contains at least one of calcium carbonate, silica, $SiO_2$ and $Al_2O_3$.

3. The semiconductor light emitting device according to claim 2 wherein said sealing resin is made of silicone resin.

* * * * *